(12) United States Patent
Hong et al.

(10) Patent No.: US 12,040,216 B2
(45) Date of Patent: Jul. 16, 2024

(54) SUBSTRATE SUPPORTING MEMBER, SUBSTRATE TREATING APPARATUS INCLUDING THE SAME AND SUBSTRATE TREATING METHOD THEREOF

(71) Applicant: SEMES Co., Ltd., Chungcheongnam-do (KR)

(72) Inventors: Yong Hoon Hong, Seoul (KR); Kang Suk Lee, Chungcheongnam-do (KR); Hyeon Jun Lee, Chungcheongnam-do (KR); So Young Jang, Sejong-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 366 days.

(21) Appl. No.: 17/386,829

(22) Filed: Jul. 28, 2021

(65) Prior Publication Data

US 2022/0044959 A1    Feb. 10, 2022

(30) Foreign Application Priority Data

Aug. 10, 2020    (KR) .................. 10-2020-0099682

(51) Int. Cl.
*H01L 21/687* (2006.01)
*H01L 21/67* (2006.01)

(52) U.S. Cl.
CPC .. *H01L 21/68742* (2013.01); *H01L 21/67023* (2013.01); *H01L 21/68792* (2013.01); *H01L 21/67051* (2013.01); *H01L 21/67253* (2013.01)

(58) Field of Classification Search
CPC ......... H01L 21/68792; H01L 21/67051; H01L 21/68742; H01L 21/67023; H01L 21/67253
See application file for complete search history.

(56) References Cited

U.S. PATENT DOCUMENTS 5,904,779 A    5/1999  Dhindsa et al.
6,646,857 B2  11/2003  Anderson et al.
(Continued)

FOREIGN PATENT DOCUMENTS

JP        05243364 A    9/1993
JP     2004040047 A    2/2004
(Continued)

OTHER PUBLICATIONS

Machine Translation of KR20100117528A to Ni et al., Nov. 2010. (Year: 2010).*

(Continued)

*Primary Examiner* — Benjamin L Osterhout
(74) *Attorney, Agent, or Firm* — Buchanan Ingersoll & Rooney PC

(57) ABSTRACT

A substrate supporting member capable of controlling the flow of charges on a substrate by controlling ground resistance values of a guide pin and a support pin using a variable resistor, and a substrate treating apparatus including the same are provided. The substrate supporting member includes the body; a support pin installed on the body and for supporting the substrate; a guide pin installed on the body and for supporting the substrate; and a charge control device for controlling a charge around the substrate by controlling an electrical connection between the support pin and a first resistor and an electrical connection between the guide pin and a second resistor.

20 Claims, 13 Drawing Sheets

(56) References Cited

U.S. PATENT DOCUMENTS

| | | | |
|---|---|---|---|
| 10,002,754 | B2 | 6/2018 | Tanaka |
| 10,886,133 | B2 | 1/2021 | Shimizu et al. |
| 2002/0141133 | A1* | 10/2002 | Anderson ............ H01L 21/6831 |
| | | | 279/128 |
| 2010/0271744 | A1* | 10/2010 | Ni .......................... H01L 22/14 |
| | | | 361/233 |
| 2017/0221750 | A1* | 8/2017 | Cotlear ............... H01L 21/6831 |
| 2018/0047576 | A1 | 2/2018 | Takahashi et al. |

FOREIGN PATENT DOCUMENTS

| | | | |
|---|---|---|---|
| JP | 4060018 | B2 * | 3/2008 |
| JP | 2008078283 | A | 4/2008 |
| JP | 2010182923 | A | 8/2010 |
| JP | 2016184701 | A | 10/2016 |
| JP | 2017017221 | A | 1/2017 |
| JP | 2018029135 | A | 2/2018 |
| JP | 2018046062 | A | 3/2018 |
| KR | 20000057603 | A | 9/2000 |
| KR | 20030056521 | A | 7/2003 |
| KR | 20030088479 | A | 11/2003 |
| KR | 20050092583 | A | 9/2005 |
| KR | 20070040639 | A | 4/2007 |
| KR | 20100117528 | A * | 11/2010 |
| KR | 20170014327 | A | 2/2017 |

OTHER PUBLICATIONS

Machine Translation of JP4060018B2 to Shin et al., Mar. 2008. (Year: 2008).*

Japanese Notice of Reasons for Refusal for Japanese Application No. 2021-117666, dated Aug. 23, 2022, with translation, 10 pages.

Korean Request for the Submission of an Opinion for Korean Application No. 10-2020-0099682, dated Nov. 2, 2022 with translation, 13 pages.

* cited by examiner

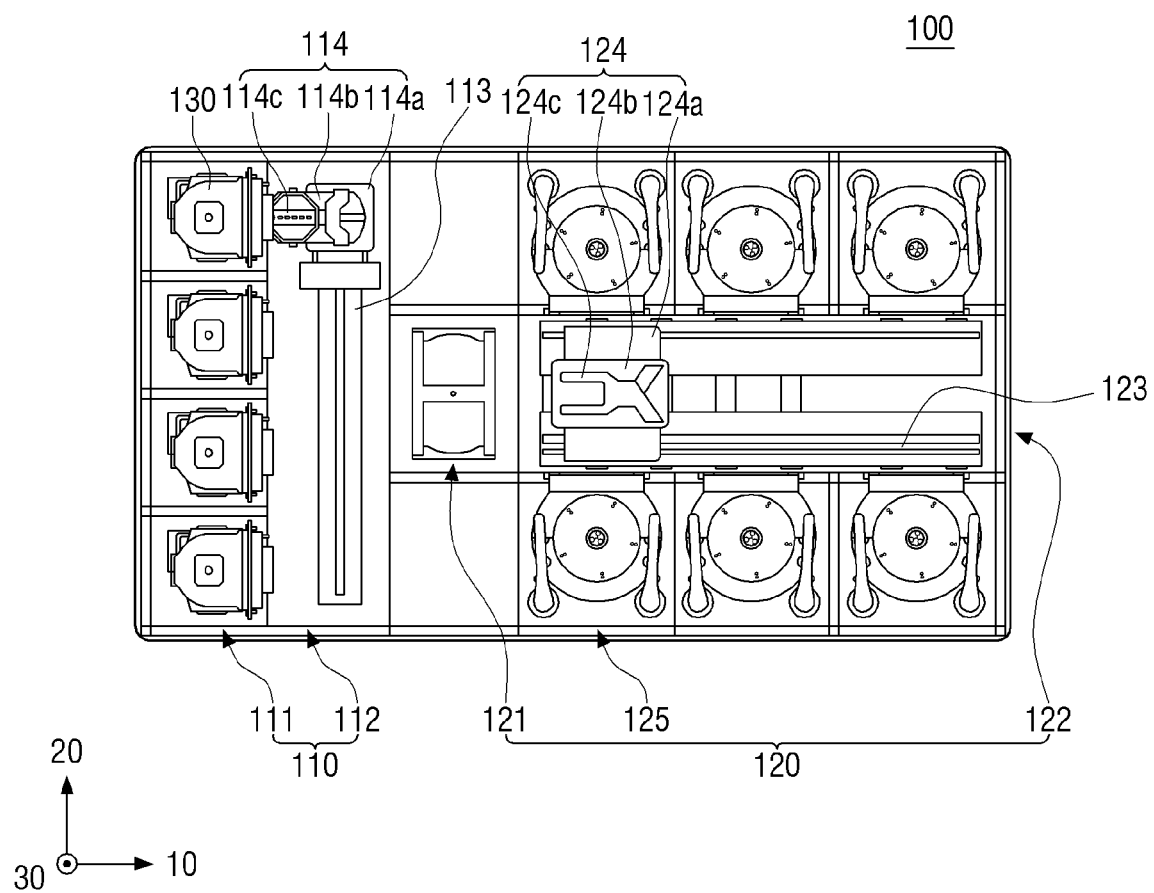

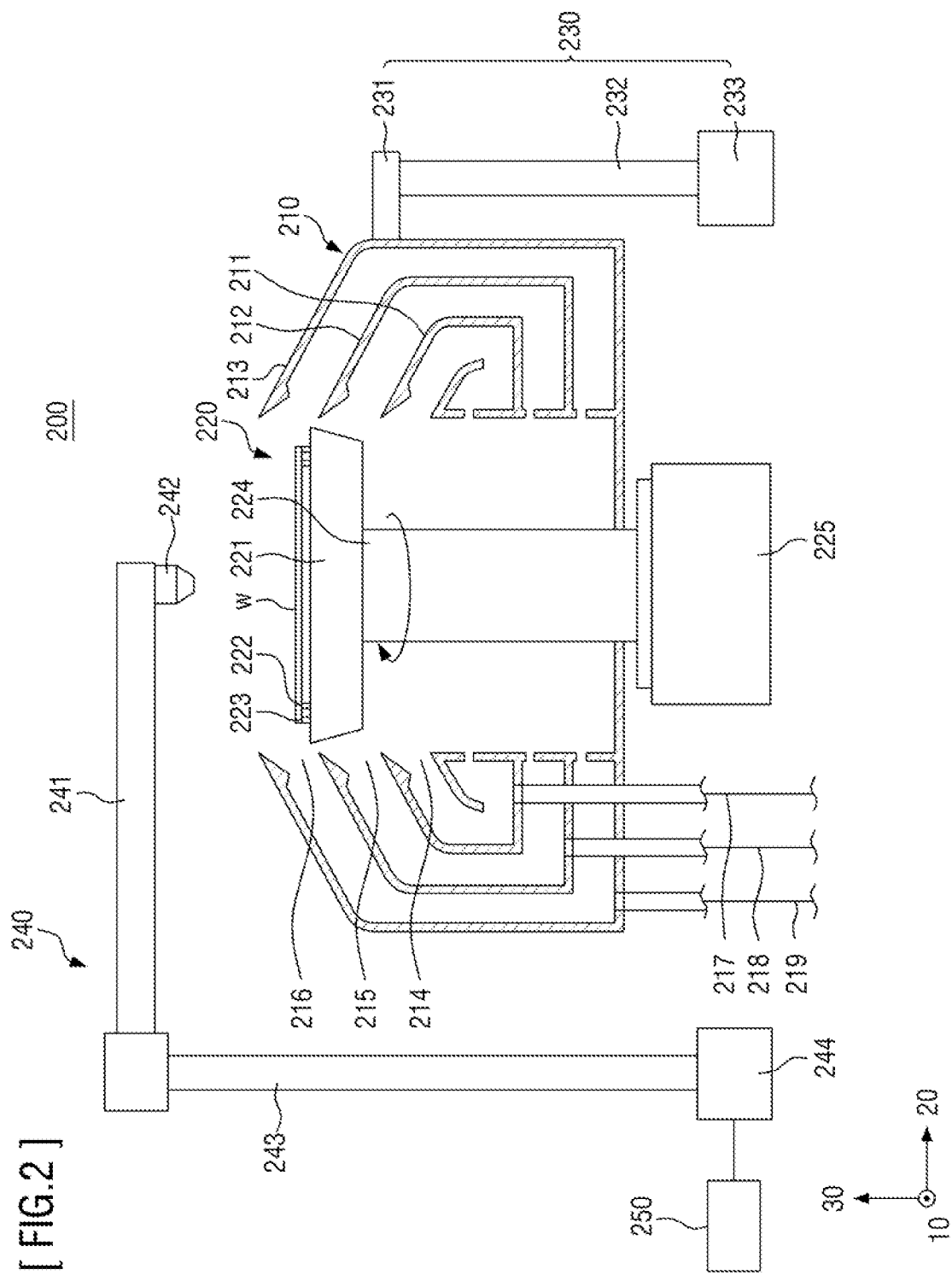
[FIG.2]

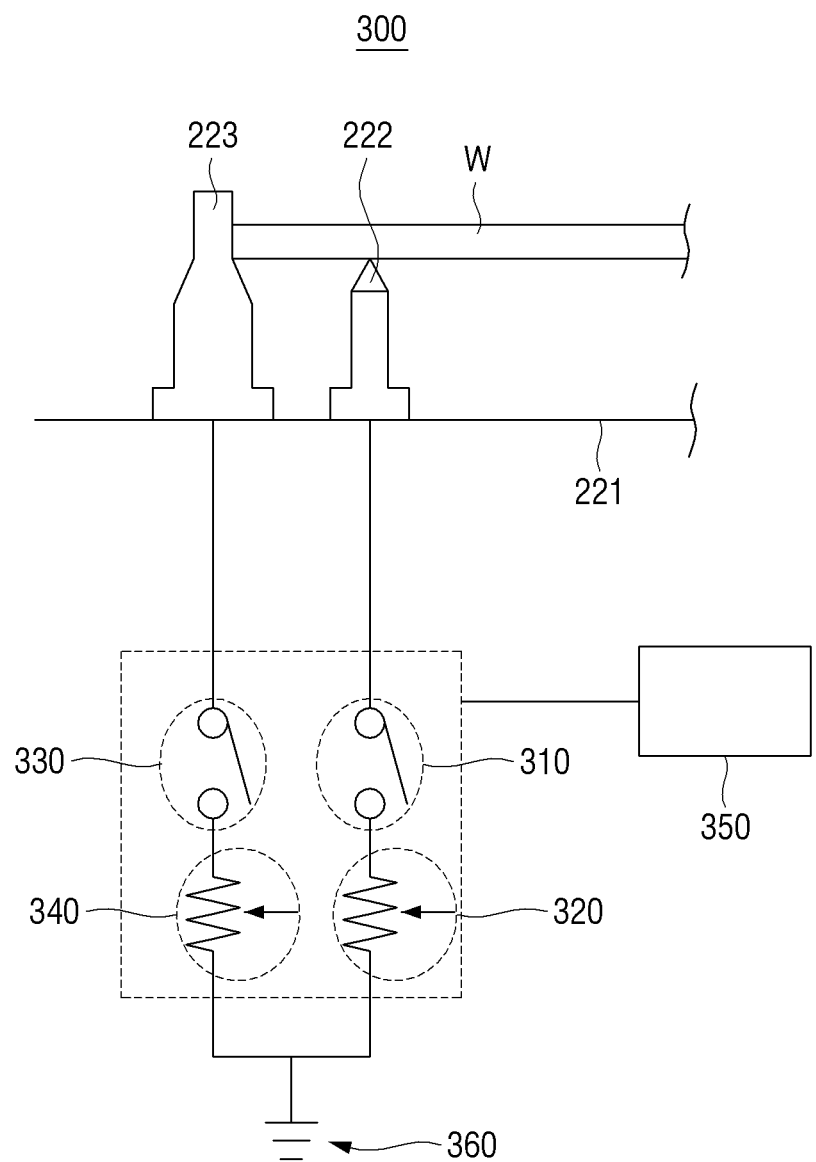

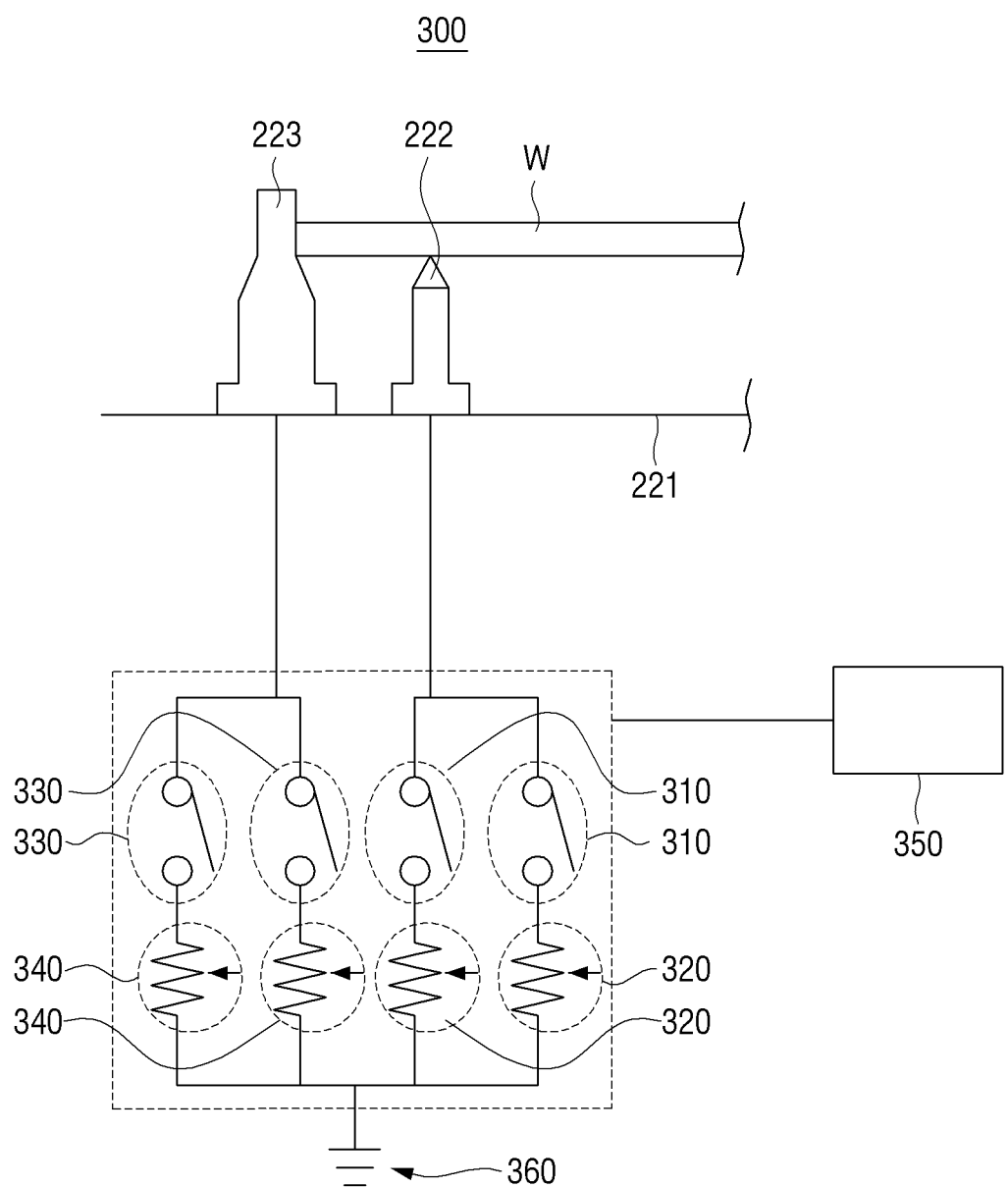
[ FIG.4 ]

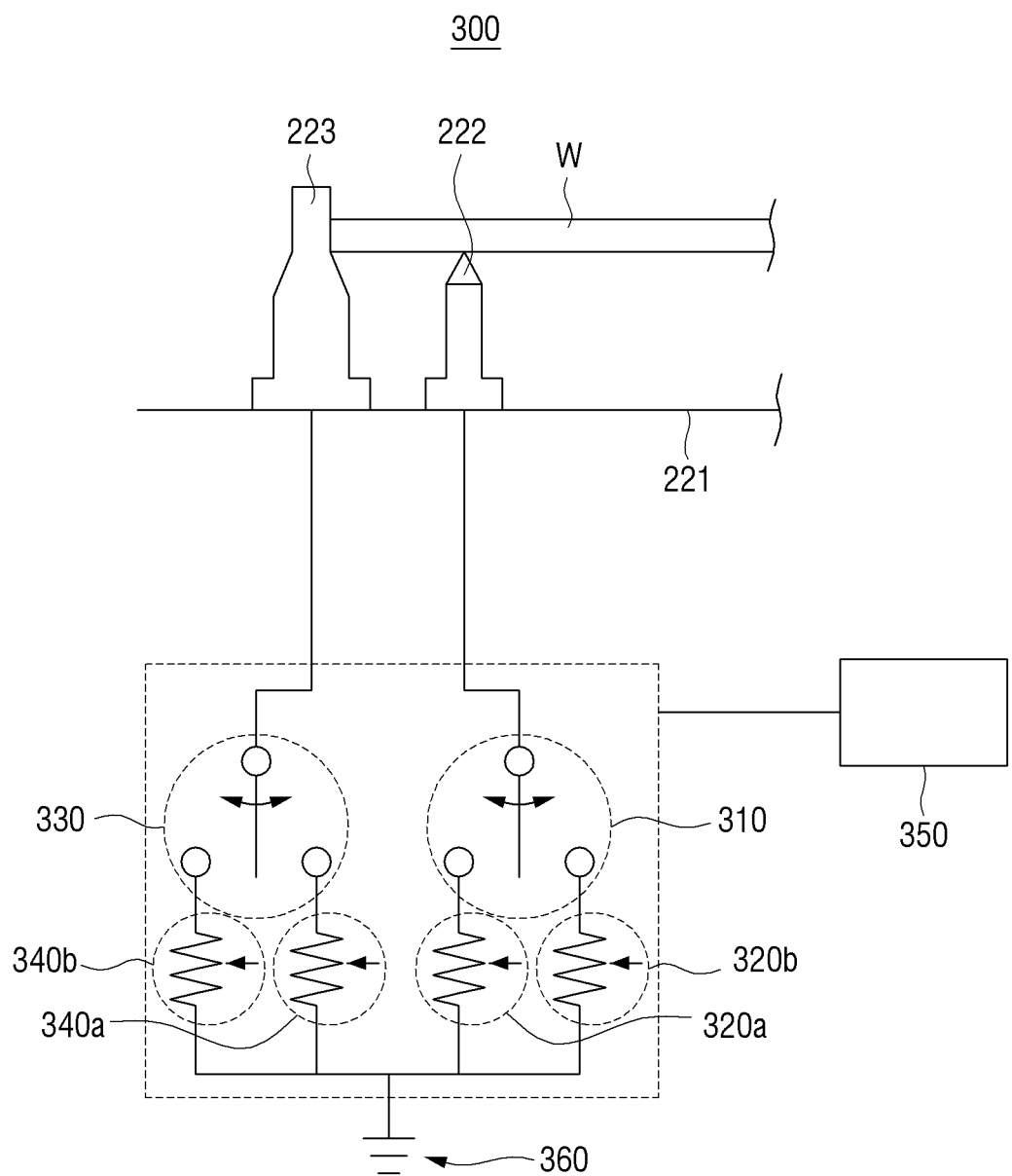
[FIG.5]

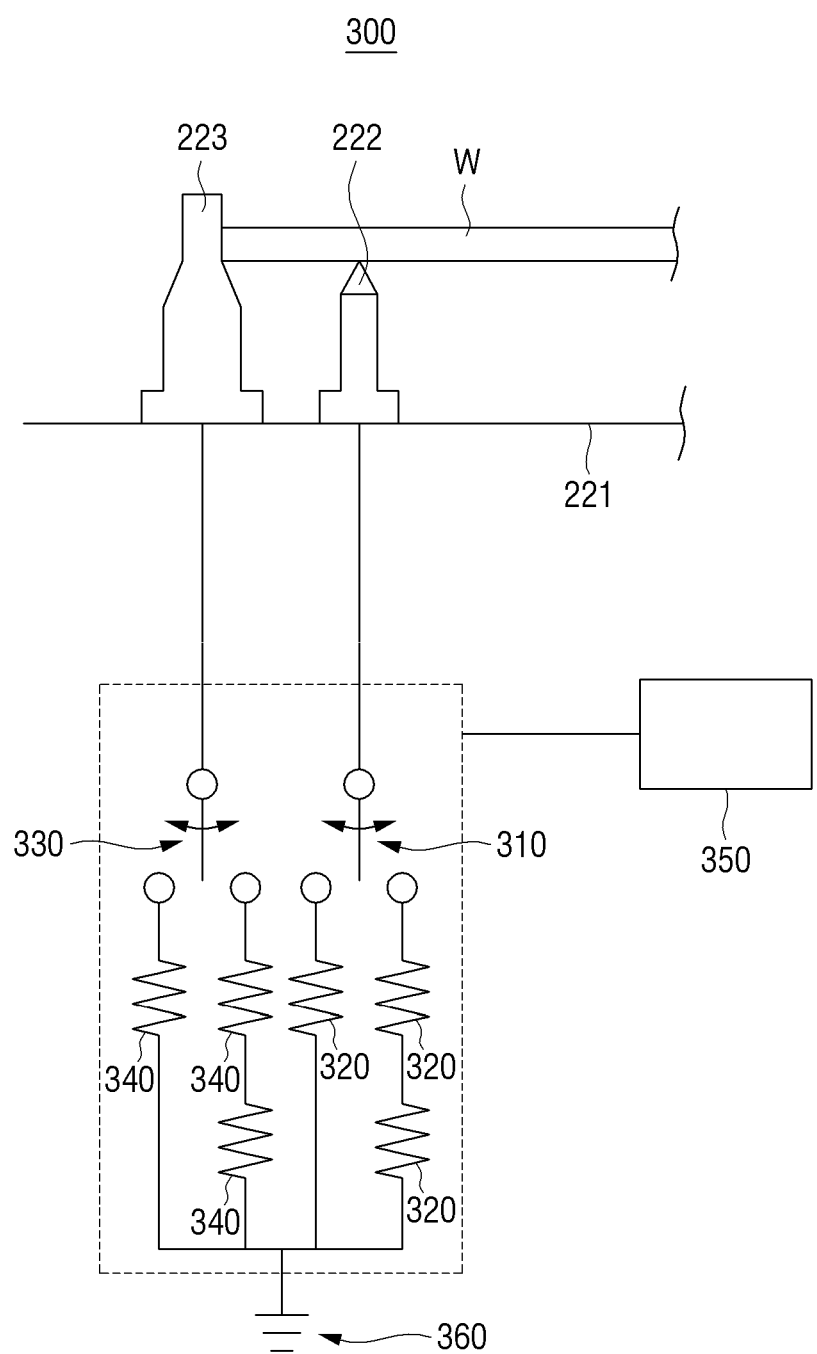
[FIG.6]

[FIG.7]
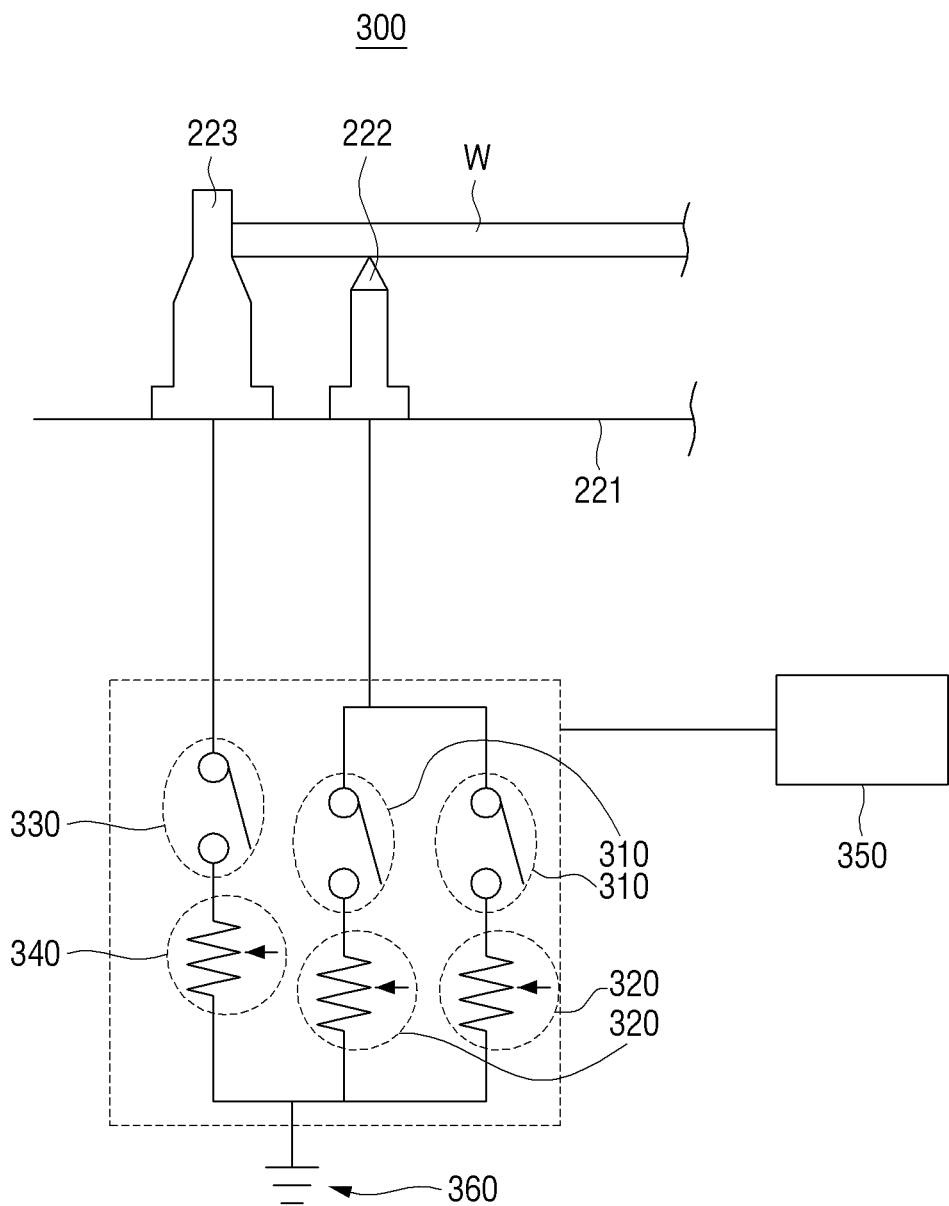

[ FIG.8 ]
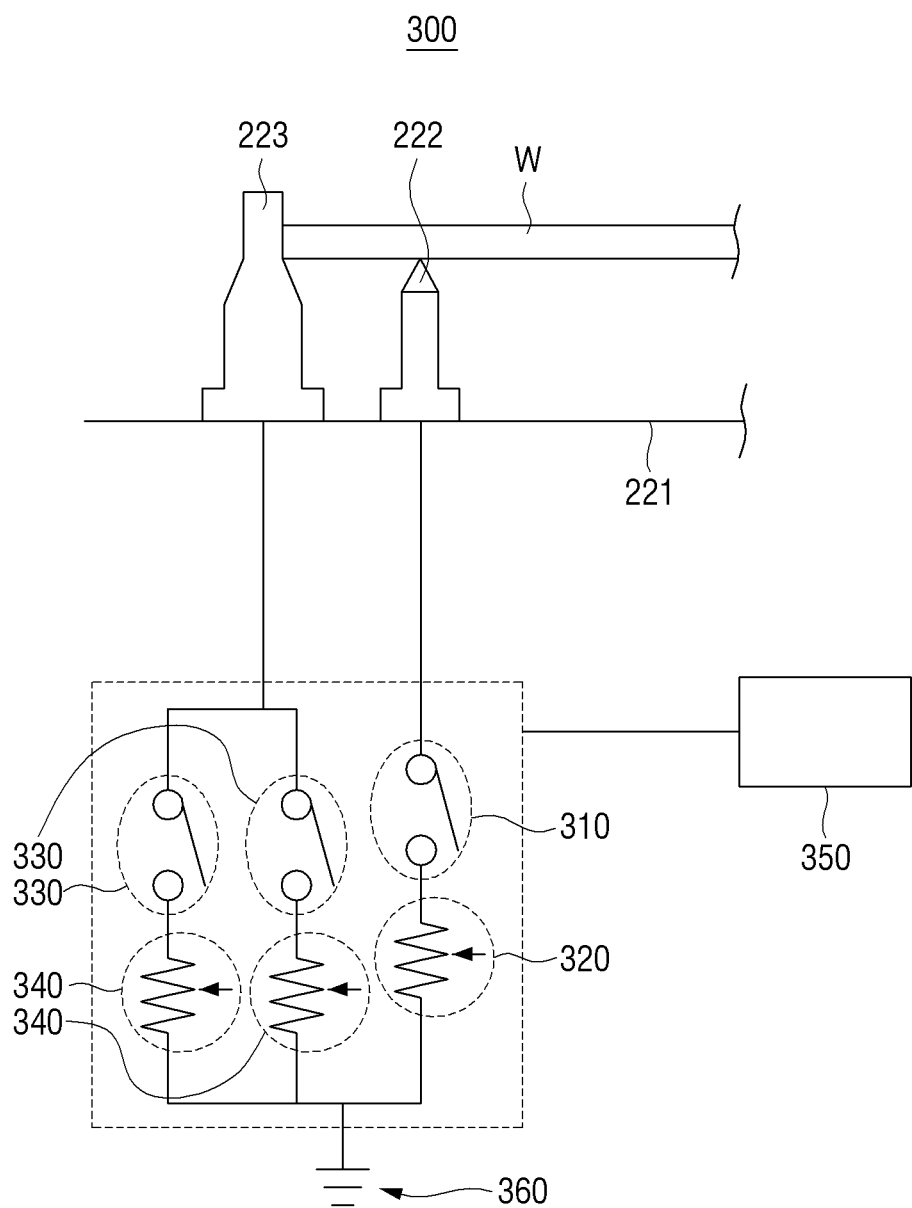

[ FIG.9 ]
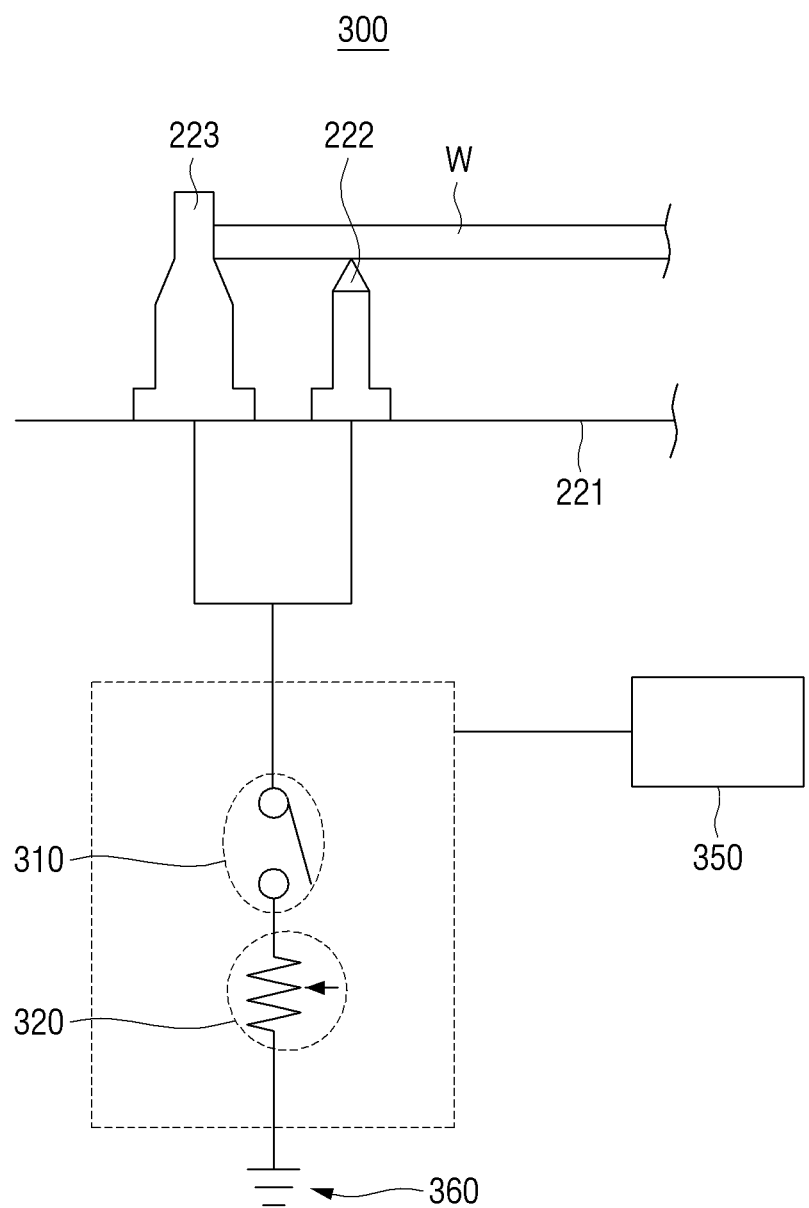

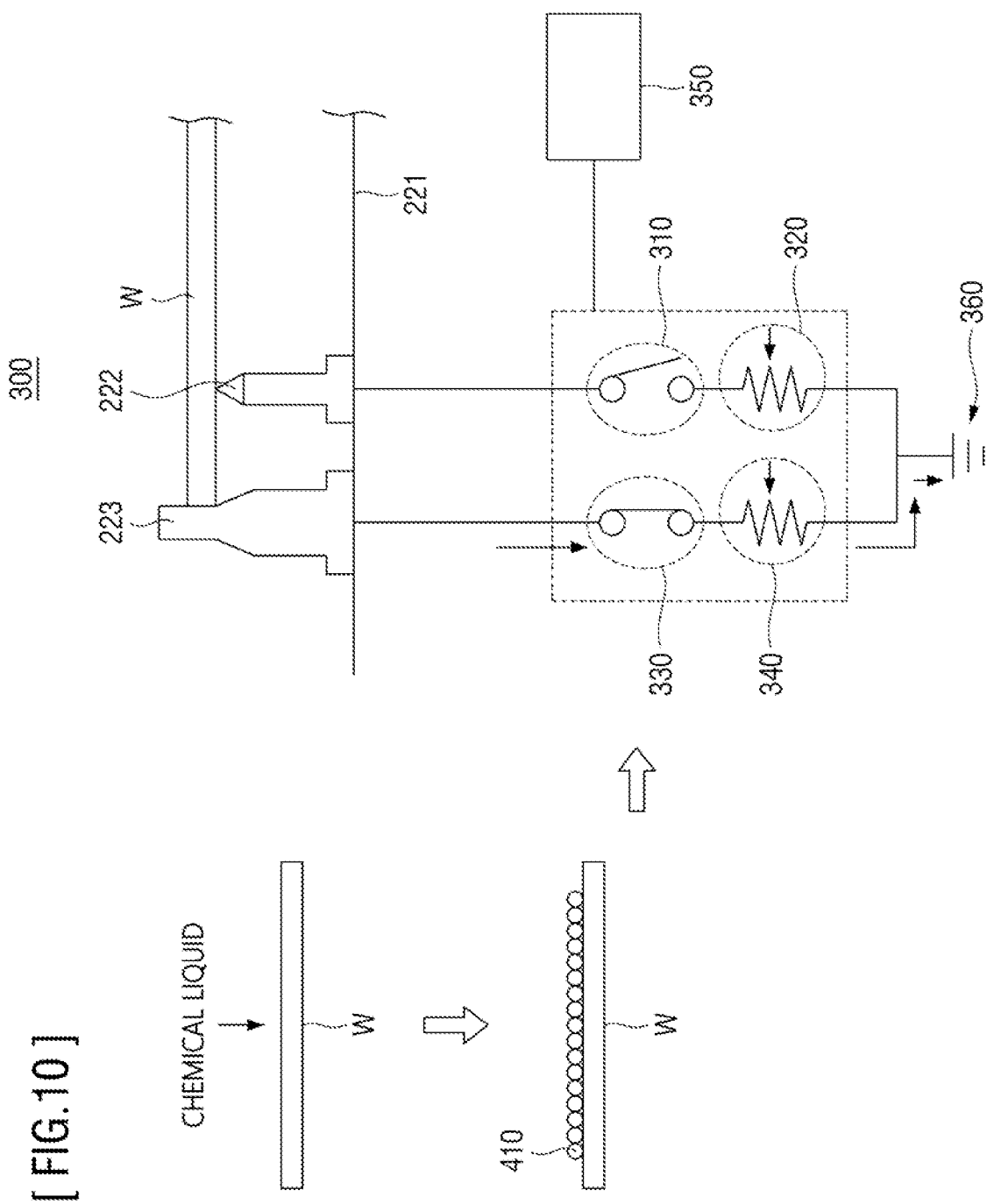
[ FIG.10 ]

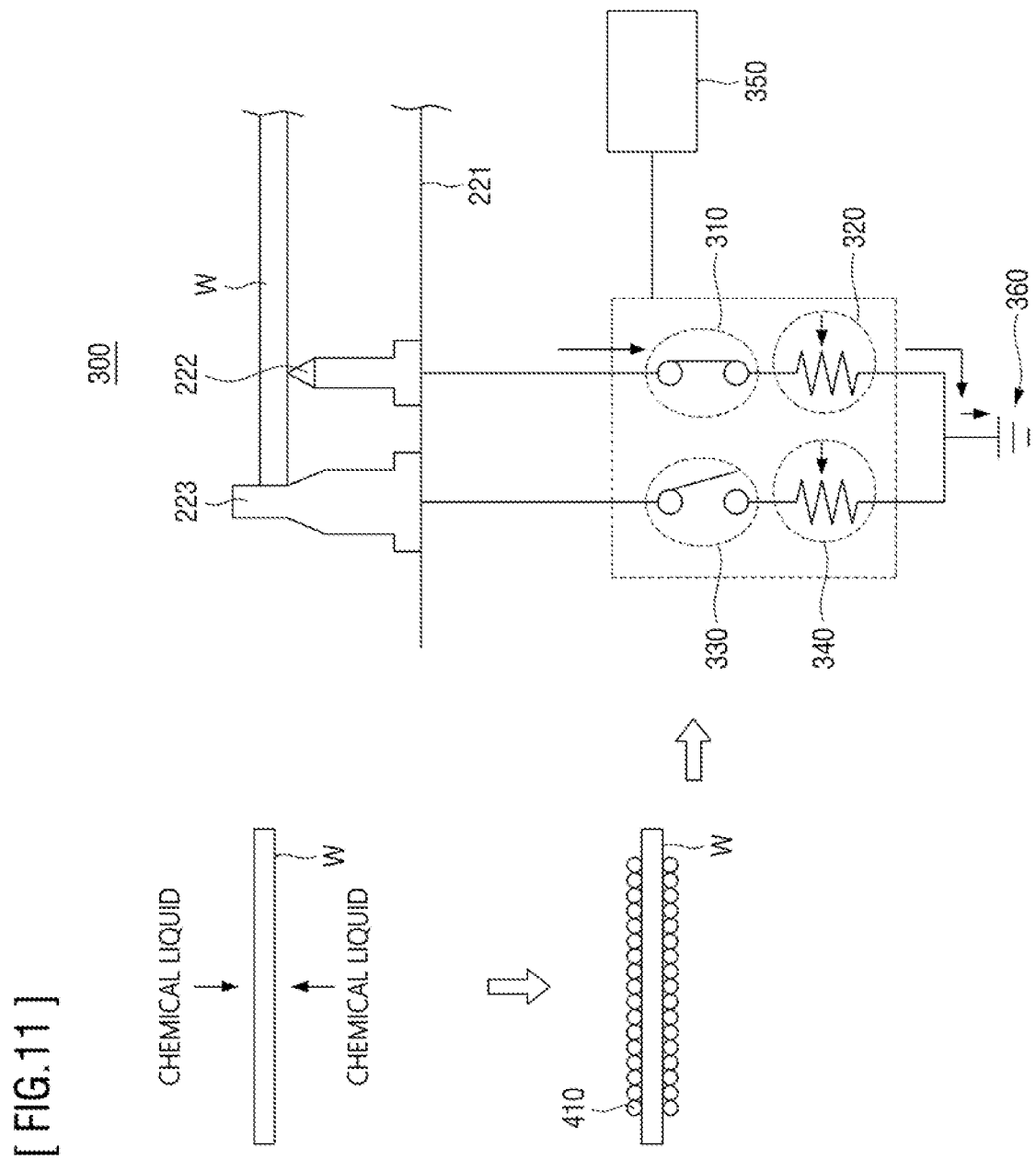

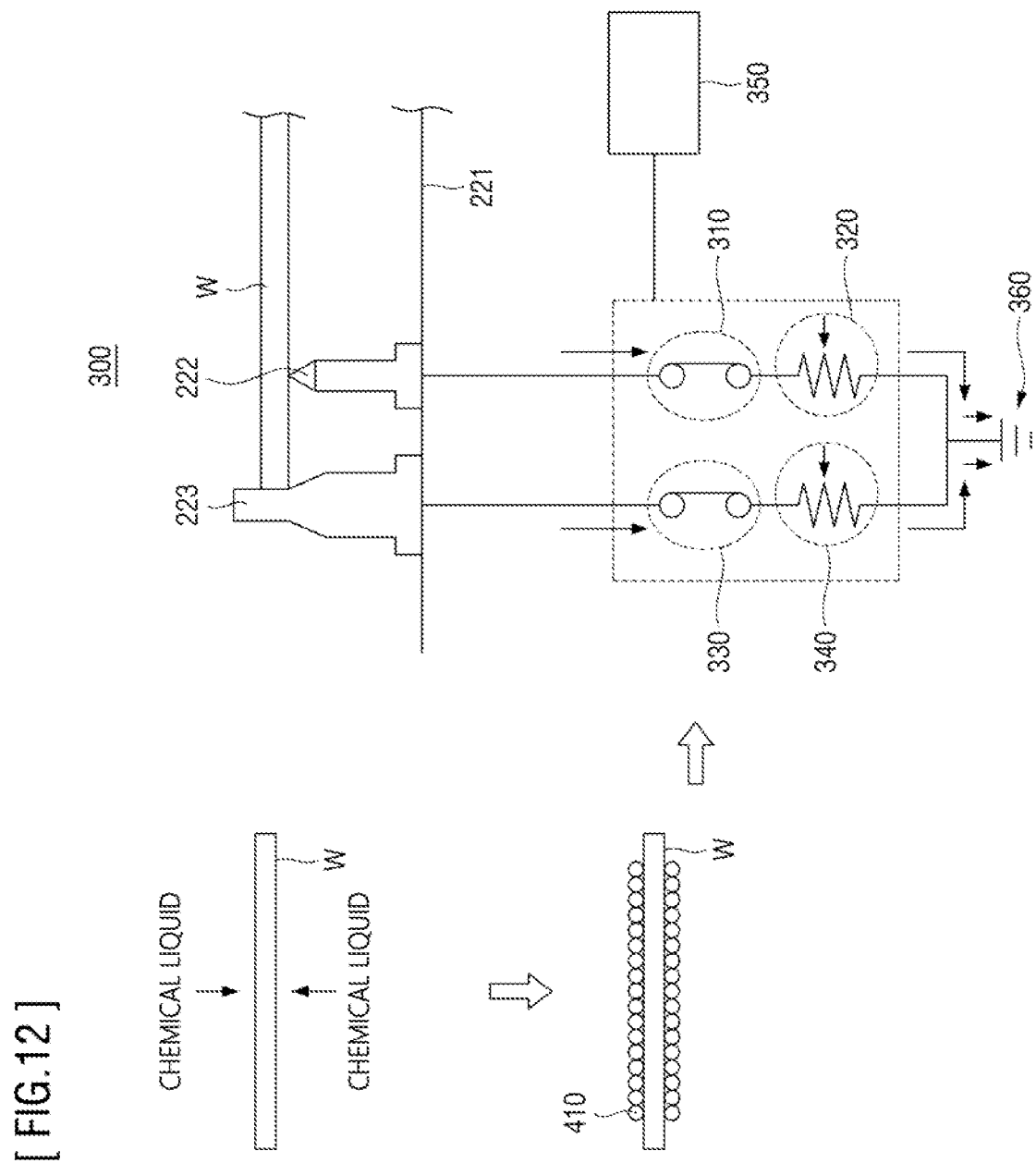

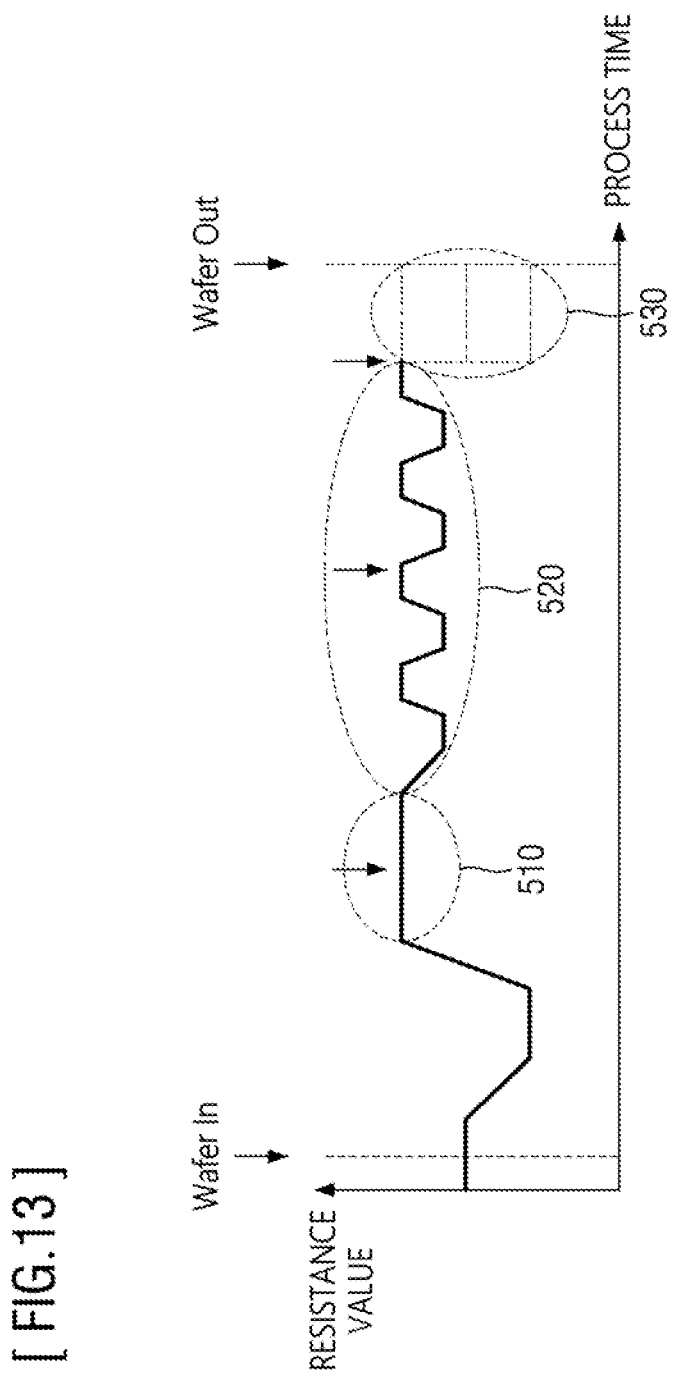

SUBSTRATE SUPPORTING MEMBER, SUBSTRATE TREATING APPARATUS INCLUDING THE SAME AND SUBSTRATE TREATING METHOD THEREOF

CROSS REFERENCE TO RELATED APPLICATION

This application claims the benefit of Korean Patent Application No. 10-2020-0099682, filed on Aug. 10, 2020, in the Korean Intellectual Property Office, the disclosure of which is incorporated herein by reference in its entirety.

1. FIELD OF THE INVENTION

The present invention relates to a substrate supporting member for supporting a substrate, and a substrate treating apparatus including the same and method. More specifically, it relates to a substrate supporting member for supporting a substrate when cleaning a substrate, and a substrate treating apparatus including the same and method.

2. BACKGROUND OF THE INVENTION

A semiconductor device can be manufactured by forming a predetermined pattern on a substrate. When forming a predetermined pattern on a substrate, a number of processes may be continuously performed in a semiconductor manufacturing facility.

In general, a space where semiconductor manufacturing facilities are located can be defined as FAB. Inside such FAB, a number of processes may be sequentially performed such as a deposition process for forming a film on a semiconductor substrate, a polishing process for flattening a film, and a photo-lithography process for forming a photo-resist pattern on the film, an etching process, in which a film is formed into a pattern having electrical characteristics using a photo-resist pattern, an ion implantation process, in which specific ions are implanted into a predetermined area of a semiconductor substrate, a cleaning process for removing a contaminant source on the semiconductor substrate, and an inspection process for inspecting the surface of the semiconductor substrate, on which the pattern is formed.

SUMMARY OF THE INVENTION

When cleaning the substrate using a chemical liquid, it is necessary to adjust the charge on the substrate. Conventionally, a guide pin supporting a substrate and a motor shaft installed inside a chuck are grounded to adjust the charge on the substrate.

However, in the case of adjusting the charge in this manner, an aluminum plate (Al Plate) electrically connected to the guide pin had to be separately provided inside the chuck.

Further, the resistance capability may vary according to the material of the guide pin, and accordingly, the deviation of an etching rate (ER), thickness and edge may occur.

Further, there was no system in the chuck to control the ground resistance value, so charges could be indiscriminately escaped.

The problem to be solved in the present invention is to provide a substrate supporting member capable of adjusting the flow of charges on the substrate by controlling the ground resistance values of the guide pins and the support pins using a variable resistor, and a substrate treating apparatus having the same and method.

The problems of the present invention are not limited to the problems mentioned above, and other problems that are not mentioned will be clearly understood by those skilled in the art from the following description.

One aspect of the substrate supporting member of the present invention for achieving the above comprises a body; a support pin installed on the body and for supporting a substrate; a guide pin installed on the body and for supporting the substrate; and a charge control device for controlling a charge around the substrate by controlling an electrical connection between the support pin and a first resistor and an electrical connection between the guide pin and a second resistor.

Wherein the charge control device may comprise a first resistor installed on a first line connecting the support pin and a ground; a first switch installed on the first line and for switching an electrical connection between the support pin and the first resistor; a second resistor installed on a second line connecting the guide pin and the ground; a second switch installed on the second line and for switching an electrical connection between the guide pin and the second resistor; and a control unit for controlling switching of the first switch and the second switch.

Wherein the first resistor is installed on a first line connecting the support pin and a ground, the second resistor is installed on a second line connecting the guide pin and the ground, and the at least one first resistor and the at least one second resistor may be installed.

Wherein when a plurality of first resistors are installed, a charge amount of the charge may be controlled according to the number of first resistors electrically connected to the support pin among the plurality of first resistors, and/or when a plurality of second resistors are installed, a charge amount of the charge may be controlled according to the number of second resistors electrically connected to the guide pin among the plurality of second resistors.

Wherein a plurality of the first resistors are installed on the first line connecting the support pin and the ground, and the plurality of first resistors may be connected in parallel, and/or a plurality of second resistors are installed on the second line connecting the guide pin and the ground, and the plurality of second resistors may be connected in parallel.

Wherein when the plurality of first resistors are connected in parallel, the plurality of first resistors may have different resistance values, and/or when the plurality of second resistors are connected in parallel, the plurality of second resistors may have different resistance values.

Wherein a plurality of the first resistors are installed on the first line connecting the support pin and the ground, and at least some of the first resistors among the plurality of first resistors may be connected in series, and/or when a plurality of second resistors are installed on the second line connecting the guide pin and the ground, and at least some of the second resistors among the plurality of second resistors may be connected in series.

Wherein when a plurality of first resistors are installed, at least two first resistors among the plurality of first resistors may have different resistance values, and a charge amount of the charge may be precisely controlled by using the at least two first resistors, and/or when a plurality of second resistors are installed, at least two second resistors among the plurality of second resistors have different resistance values, and a charge amount of the charge may be precisely controlled by using the at least two second resistors.

Wherein the at least one support pin may be electrically connected to the first resistor, and/or the at least one guide pin may be electrically connected to the second resistor.

Wherein at least one of the first resistor and the second resistor may be a variable resistor.

Wherein the first resistor and the second resistor may be installed inside the body.

Wherein a charge built up around the substrate may be used to treat the substrate.

Wherein the charge control device may control a charge when cleaning the substrate using a chemical liquid.

Wherein the charge control device may control an electrical connection between the guide pin and the second resistor when the chemical liquid is supplied to an upper portion of the substrate.

Wherein the charge control device may control an electrical connection between the support pin and the first resistor when the chemical liquid is supplied to upper and lower portions of the substrate.

Wherein the charge control device may further control an electrical connection between the guide pin and the second resistor.

Wherein a plurality of first electrical connections between the support pin and the first resistor are provided, and the charge control device may control at least one first electrical connection among the plurality of first electrical connections, and/or a plurality of second electrical connections between the guide pin and the second resistor are provided, and the charge control device may control at least one second electrical connection among the plurality of second electrical connections.

Wherein the charge control device may control the at least one first electrical connection and/or the at least one second electrical connection based on an etching rate of the substrate.

Wherein the charge control device may control a charge before supplying the chemical liquid to the substrate.

Wherein the charge control device may repeatedly control a charge with a time difference when the chemical liquid is supplied to the substrate.

The other aspect of the substrate supporting member of the present invention for achieving the above comprises a body; a support pin installed on the body and for supporting the substrate; a guide pin installed on the body and for supporting the substrate; and a charge control device for controlling a charge around the substrate by controlling an electrical connection between the support pin and a first resistor and an electrical connection between the guide pin and a second resistor, wherein the charge control device controls the charge before the chemical liquid is supplied to the substrate and when the chemical liquid is supplied to the substrate, and repeatedly controls the charge with a time difference when the chemical liquid is supplied to the substrate.

The other aspect of the substrate treating apparatus of the present invention for achieving the above comprises a supporting member including a body, a support pin installed on the body and supporting a substrate, and a guide pin installed on the body and supporting the substrate; a spray member for supplying a chemical liquid onto an upper surface of the substrate; a back nozzle for supplying a chemical liquid onto a bottom surface of the substrate; and a charge control device for controlling a charge around the substrate by controlling an electric connection between the support pin and a first resistor and an electric connection between the guide pin and a second resistor.

Wherein the substrate treating apparatus may be an apparatus for cleaning the substrate using the chemical liquid.

One aspect of the substrate treating method of the present invention for achieving the above comprises a first step for controlling a charge amount of a charge around a substrate before treating the substrate; and a second step for controlling a charge amount of a charge around the substrate while treating the substrate.

Wherein the second step may treat the substrate using a chemical liquid, and may repeatedly control a charge amount of a charge with a time difference when the chemical liquid is supplied to the substrate.

Details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a plan view schematically showing the internal structure of a substrate treating system used to clean a substrate;

FIG. 2 is a cross-sectional view schematically illustrating an internal structure of a substrate treating apparatus provided in a process chamber of FIG. 1;

FIG. 3 is a diagram schematically showing a charge control device installed on a supporting member according to a first embodiment of the present invention;

FIG. 4 is a diagram schematically showing a charge control device installed on a supporting member according to a second embodiment of the present invention;

FIG. 5 is a diagram schematically showing a charge control device installed on a supporting member according to a third embodiment of the present invention;

FIG. 6 is a diagram schematically showing a charge control device installed on a supporting member according to a fourth embodiment of the present invention;

FIG. 7 is a diagram schematically showing a charge control device installed on a supporting member according to a fifth embodiment of the present invention;

FIG. 8 is a diagram schematically showing a charge control device installed on a supporting member according to a sixth embodiment of the present invention;

FIG. 9 is a diagram schematically showing a charge control device installed on a supporting member according to a seventh embodiment of the present invention;

FIG. 10 is an exemplary diagram of a case, in which charges are controlled using a guide pin;

FIG. 11 is a first exemplary diagram in the case of controlling a charge using a support pin;

FIG. 12 is a second exemplary diagram in the case of controlling a charge using a support pin; and FIG. 13 is an exemplary diagram illustrating a case, in which a resistance connected to a support pin and a guide pin is used in a substrate treating process.

DETAILED DESCRIPTION OF THE INVENTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements are referred to as "on" or "above" of other elements, it includes not only when directly above of the other elements, but also other elements intervened in the middle. On the other hand, when elements are referred to as "directly on" or "directly above," it indicates that no other element is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

The present invention relates to a substrate supporting member capable of adjusting the flow of charges on a substrate by controlling ground resistance values of a guide pin and a support pin using a variable resistor, and a substrate treating apparatus having the same.

Hereinafter, the present invention will be described in detail with reference to the drawings.

FIG. 1 is a plan view schematically showing the internal structure of a substrate treating system used to clean a substrate.

According to FIG. 1, the substrate treating system 100 may include an index module 110 and a process treating module 120.

The index module 110 and the process treating module 120 may be sequentially arranged in one direction. In the present embodiment, a direction, in which the index module 110 and the process treating module 120 are arranged, is defined as the first direction 10. In addition, a direction perpendicular to the first direction 10 when viewed from above is defined as the second direction 20, and a direction perpendicular to a plane including the first direction 10 and the second direction 20 is defined as the third direction 30.

The index module 110 is arranged in front of the process treating module 120. The index module 110 may include a load port 111 and a transfer frame 112.

The carrier 130 accommodating the substrate is mounted on the load port 111. A plurality of such load ports 111 may be provided in front of the transfer frame 112, and a plurality of load ports 111 may be arranged in a row along the second direction 20.

In FIG. 1, it is shown that the index module 110 is provided with four load ports 111. However, this embodiment is not limited thereto. The number of load ports 111 may increase or decrease according to conditions such as the process efficiency of process treating module 120 and the foot-print.

The carrier 130 accommodates a plurality of substrates (e.g., wafers). The carrier 130 may have a slot (not shown) provided therein to support the edge of the substrate.

A plurality of slots may be provided in the third direction 30. In this case, the substrates may be stacked in a state spaced apart from each other along the third direction 30 to be located in the carrier 130. The carrier 130 may be implemented as, for example, a Front Opening Unified Pod (FOUP).

The transfer frame 112 transfers the substrate between the carrier 130 mounted on the load port 111 and the buffer unit 121. The transfer frame 112 may include an index rail 113 and an index robot 114.

The index rail 113 provides a path, through which the index robot 114 moves. The index rail 113 may be arranged such that its longitudinal direction is parallel to the second direction 20.

The index robot 114 directly transfers the substrate. The index robot 114 may be installed on the index rail 113 and may move linearly along the second direction 20 on the index rail 113.

The index robot 114 may include a first base 114*a*, a first body 114*b*, and an index arm 114*c*. Here, the first base 114*a* may be installed to be movable along the index rail 113.

The first body 114*b* may be coupled to the first base 114*a*. The first body 114*b* may be provided to be movable along the third direction 30 on the first base 114*a*. In addition, the first body 114*b* may be provided to be rotatable on the first base 114*a*.

The index arm 114*c* is coupled to the first body 114*b*, and may be provided to be movable forward and backward with respect to the first body 114*b*. A plurality of such index arms 114*c* may be provided on the first body 114*b* to be individually driven.

The plurality of index arms 114*c* may be stacked and arranged to be spaced apart from each other along the third direction 30. Some of the plurality of index arms 114*c* are used when transferring the substrate from the process treating module 120 to the carrier 130, and others may be used to transfer the substrate from the carrier 130 to the process treating module 120. When the plurality of index arms 114*c* are configured in this way, it is possible to obtain an effect of preventing particles generated from the substrate before treating the process from adhering to the substrate after treating the process in the process of the index robot 114 loading and unloading the substrate.

The process treating module 120 may include a buffer unit 121, a transfer chamber 122, and a process chamber 125.

The buffer unit 121 provides a space to stay between the transfer frame 112 and the transfer chamber 122 before the substrate is transferred. The buffer unit 121 may be arranged between the transfer frame 112 and the transfer chamber 122 for this purpose.

The buffer unit 121 may be provided with a slot therein (not shown), in which the substrate is mounted. A plurality of slots may be provided in the buffer unit 121, and a plurality of slots may be provided to be spaced apart from each other along the third direction 30. Meanwhile, in the buffer unit 121, a surface facing the transfer frame 112, a surface facing the transfer chamber 122, and the like may be opened, respectively.

The transfer chamber 122 transfers a substrate between the buffer unit 121 and the process chamber 125. The transfer chamber 122 may include a guide rail 123 and a main robot 124. Meanwhile, the transfer chamber 122 may transfer a substrate between two different process chambers 125.

The guide rail 123 provides a path through which the main robot 124 moves. The guide rail 123 may be arranged such that its longitudinal direction is parallel to the first direction 10.

The main robot 124 directly transfers the substrate. The main robot 124 may be installed on the guide rail 123, and may move linearly along the first direction 10 on the guide rail 123.

The main robot 124 may include a second base 124a, a second body 124b, and a main arm 124c. Here, the second base 124a may be installed to be movable along the guide rail 123.

The second body 124b may be coupled to the second base 124a. The second body 124b may be provided to be movable along the third direction 30 on the second base 124a. In addition, the second body 124b may be provided to be rotatable on the second base 124a.

The main arm 124c is coupled to the second body 124b and may be provided to be movable forward and backward with respect to the second body 124b. A plurality of such main arms 124c may be provided on the second body 124b to be individually driven.

The plurality of main arms 124c may be stacked and arranged to be spaced apart from each other along the third direction 30. Some of the plurality of main arms 124c may be used when transferring a substrate from the buffer unit 121 to the process chamber 125, and others may be used when transferring the substrate from the process chamber 125 to the buffer unit 12.

The transfer chamber 122 may be arranged so that its longitudinal direction is parallel to the first direction 10. In this case, a plurality of process chambers 125 may be respectively arranged on both sides of the transfer chamber 122 along the second direction 20, and a plurality of process chambers 125 may be arranged on each side of the transfer chamber 122 along the first direction 10.

The plurality of process chambers 125 may be stacked and arranged on each other. That is, the plurality of process chambers 125 may be arranged in an X*Y arrangement on one side of the transfer chamber 122. Here, X is a natural number of 1 or more, which means the number of process chambers 125 provided in a row along the first direction 10, and Y is a natural number of 1 or more, which means the number of process chambers 125 provided in a row along the third direction 30.

For example, when four process chambers 125 are provided on one side of the transfer chamber 122, the four process chambers 125 may be arranged in an arrangement of 2*2, and in the case where six process chambers 125 are provided on one side of the transfer chamber 122, the six process chambers 125 may be arranged in an arrangement of 3*2.

Meanwhile, the number of process chambers 125 may increase or decrease. In addition, the process chamber 125 may be provided only on one side of the transfer chamber 122, or may be provided in a single layer on one or both sides of the transfer chamber 122.

A substrate treating apparatus cleans a substrate using a chemical liquid. Such a substrate treating apparatus may be provided in the process chamber 125.

FIG. 2 is a cross-sectional view schematically illustrating an internal structure of a substrate treating apparatus provided in a process chamber of FIG. 1. The following description refers to FIGS. 1 and 2.

The substrate treating apparatus 200 may be provided to have the same structure in the plurality of process chambers 125. However, this embodiment is not limited thereto. The substrate treating apparatus 200 may be provided having different structures in the plurality of process chambers 125 according to the type of chemical liquid, the type of process method, and the like.

The plurality of process chambers 125 may be divided into a plurality of groups. In this case, substrate treating apparatuses in process chambers belonging to the same group may have the same structure, and substrate treating apparatuses in process chambers belonging to different groups may have different structures.

For example, when first process chambers belonging to the first group are arranged on one side of the transfer chamber 122 and second process chambers belonging to the second group are arranged on the other side of the transfer chamber 122, the substrate treating apparatuses in the first process chambers may have the same structure, and the substrate treating apparatuses in the second process chambers may have the same structure. In addition, the substrate treating apparatuses in the first process chambers may have a structure different from that of the substrate treating apparatuses in the second process chambers.

In addition, for example, when the third process chambers belonging to the third group are arranged on a lower layer of one side and the other side of the transfer chamber 122, respectively, and the fourth process chambers belonging to the fourth group are arranged on an upper layer of one side and the other side of the transfer chamber 122, the substrate treating apparatuses in the third process chambers may have the same structure, and substrate treating apparatuses in the fourth process chambers may have the same structure. In addition, the substrate treating apparatuses in the third process chambers may have a structure different from that of the substrate treating apparatuses in the fourth process chambers.

The substrate treating apparatus 200 may include, for example, a cup 210, a supporting member 220, an elevating unit 230, a spray member 240, and a control unit 250, as shown in FIG. 2.

The cup 210 provides a space, in which a process of treating the substrate (W) is performed. This cup 210 may be formed such that the upper portion thereof is open.

The cup 210 may include an internal recovery container 211, an intermediate recovery container 212 and an external recovery container 213. At this time, each of the recovery containers 211, 212, 213 may recover treatment liquids different from each other among treatment liquids used in the process.

The internal recovery container 211 may be provided in an annular ring shape surrounding the supporting member 220. At this time, the inner space 214 of the internal recovery container 211 may function as an inlet, through which the treatment liquid flows into the internal recovery container 211.

The intermediate recovery container 212 may be provided in an annular ring shape surrounding the internal recovery container 211. At this time, the space 215 between the internal recovery container 211 and the intermediate recovery container 212 may function as an inlet, through which the treatment liquid flows into the intermediate recovery container 212.

The external recovery container 213 may be provided in an annular ring shape surrounding the intermediate recovery container 212. At this time, the space 216 between the intermediate recovery container 212 and the external recovery container 213 may function as an inlet, through which the treatment liquid flows into the external recovery container 213.

Each of the recovery containers 211, 212, 213 may be connected to recovery lines 217, 218, 219 extending vertically in a direction below the bottom surface thereof. Each of the recovery lines 217, 218, and 219 may discharge the treatment liquid introduced through each of the recovery containers 211, 212, and 213 to the outside. The treatment liquid discharged to the outside may be treated to be reused through a treatment liquid regeneration system (not shown).

The supporting member 220 supports the substrate (W) and rotates the substrate (W) during the process. The supporting member 220 may be arranged inside the cup 210.

The supporting member 220 may include a body 221, a support pin 222, a guide pin 223, and a first supporting shaft 224.

The body 221 may have an upper surface provided in a generally circular shape when viewed from above. A first supporting shaft 224 that can be rotated by a motor 225 may be fixedly coupled to the bottom surface of the body 221. Meanwhile, a back nozzle (not shown) may be installed on the upper surface of the body 221.

The support pin 222 supports the bottom surface of the substrate (W) on the body 221. A plurality of such support pins 222 may be provided on the body 221.

The plurality of support pins 222 may be formed to protrude upward from the upper surface of the body 221. In addition, the plurality of support pins 222 may be arranged to be spaced apart at the predetermined gap on the edge of the upper surface of the body 221. The plurality of support pins 222 may be arranged to have, for example, an annular ring shape as a whole by a combination thereof. The plurality of support pins 222 may support the rear edge of the substrate (W) such that the substrate (W) is spaced apart from the upper surface of the body 221 by a predetermined distance through such a configuration.

The guide pin 223 is also referred to as a chuck pin, and supports the side portion of the substrate (W) so that the substrate (W) does not deviate laterally from the original position when the supporting member 220 rotates. Like the support pin 222, a plurality of guide pins 223 may be provided on the body 221, and may be formed to protrude upward from the upper surface of the body 221.

The guide pin 223 may be arranged farther from the center of the body 221 than the support pin 222. The guide pin 223 may be provided to be linearly movable between the standby position and the support position along the radial direction of the body 221. Here, the standby position means a position farther from the center of the body 221 than the support position.

The guide pin 223 may be located at the standby position when the substrate (W) is loaded/unloaded onto the supporting member 220, and may be located at the support position when performing the process for the substrate (W). The guide pin 223 may contact the side portion of the substrate (W) at the support position.

The elevating unit 230 is to linearly move the cup 210 in the vertical direction. As the cup 210 moves linearly in the vertical direction, the relative height of the cup 210 with respect to the supporting member 220 may be changed.

The elevating unit 230 may include a bracket 231, a moving shaft 232, and a first driving unit 233.

The bracket 231 is fixedly installed on the outer wall of the cup 210. The bracket 231 may be coupled with a moving shaft 232 that is moved in the vertical direction by the first driving unit 233.

When the substrate (W) is placed on the supporting member 220 or is lifted from the supporting member 220, the cup 210 may be lowered so that the supporting member 220 protrudes to the upper portion of the cup 210. In addition, when the process proceeds, the height of the cup 210 may be adjusted so that the treatment liquid can flow into the preset recovery containers 211, 212, 213 according to the type of treatment liquid supplied to the substrate (W).

For example, while treating the substrate (W) with the first treatment liquid, the substrate (W) may be located at a height corresponding to the inner space 214 of the internal recovery container 211. In addition, while treating the substrate (W) with the second treatment liquid, the substrate (W) may be located at a height corresponding to the space 215 between the internal recovery container 211 and the intermediate recovery container 212. In addition, while treating the substrate (W) with the third treatment liquid, the substrate (W) may be located at a height corresponding to the space 216 between the intermediate recovery container 212 and the external recovery container 213.

Meanwhile, the elevating unit 230 may move the supporting member 220 in the vertical direction instead of the cup 210.

The spray member 240 supplies a treatment liquid to the substrate (W) during the substrate treating process. The spray member 240 may include a nozzle support 241, a nozzle 242, a second supporting shaft 243 and a second driving unit 244 for this purpose.

One or a plurality of spray members 240 may be provided. When a plurality of spray members 240 are provided, a chemical liquid, a rinse liquid, an organic solvent, and the like may be provided through different spray members 240. The rinse liquid may be a first fluid, and the organic solvent may be a mixture of isopropyl alcohol vapor and an inert gas, or an isopropyl alcohol liquid.

The nozzle support 241 may be provided so that its longitudinal direction is along the second direction 20. The nozzle support 241 may be coupled to one end of the second supporting shaft 243 in a direction perpendicular to the longitudinal direction of the second supporting shaft 243. The second driving unit 244 may be coupled to the other end of the second supporting shaft 243.

The nozzle 242 may be installed on the bottom surface of the end of the nozzle support 241. The nozzle 242 may be moved to the process position and the standby position by the second driving unit 244. Here, the process position refers to a vertical upper area of the supporting member 220 that allows the nozzle 242 to discharge the treatment liquid onto the substrate (W), and the standby position refers to an area excluding the vertical upper area of the supporting member 220, that is, an area that deviates outward from the vertical upper area of the supporting member 220.

The second supporting shaft 243 may be provided so that its longitudinal direction is along the third direction 30. This second supporting shaft 243 may be coupled to the second driving unit 244 at its lower end.

The second driving unit 244 rotates and elevates the second supporting shaft 243. This second driving unit 244 is connected to the control unit 250 and may be controlled by the control unit 250.

Meanwhile, in FIG. 2, the control unit 250 is shown to be connected to the second driving unit 244. However, this embodiment is not limited thereto. The control unit 250 is connected to the first driving unit 233 as well as the second driving unit 244, and may control the first driving unit 233 as well.

When cleaning a substrate using a chemical liquid, Un-Strip and ER (Etching Rate) depend on the flow rate, characteristics, conductivity, and surface tension of the chemical liquid, and can change every moment by each facility, type of substrate, recipe and the like.

In order to prevent Un-Strip from occurring and improve ER, the charge on the substrate can be adjusted. However, when the substrate treating process is repeated in a limited space inside the substrate treating apparatus 200, an excessive amount of ±kV is continuously accumulated in material therein due to various charges such as discharge, friction, and induction, thereby causing ESD (Electro Static Discharge). Therefore, there is a need for a technology capable of preventing an ESD phenomenon when treating a substrate.

In addition, due to various charging and ionizing effects, it is possible to have a charge inside the chemical liquid. However, there is no technology capable of preventing Un-Strip from occurring and controlling ER and ESD using the charge at this time.

In addition, there is a problem in that it is difficult to monitor electrostatic force caused by surrounding materials and environmental factors of the supporting member 220.

In this embodiment, by controlling the ground resistance values of the support pin 222 and the guide pin 223 using a variable resistor, the flow of charges on the substrate (W) can be efficiently adjusted. Hereinafter, this will be described in detail.

FIG. 3 is a diagram schematically showing a charge control device installed on a supporting member according to a first embodiment of the present invention.

According to FIG. 3, the charge control device 300 may include a first switch 310, a first resistor 320, a second switch 330, a second resistor 340, and a control unit 350.

The charge control device 300 selectively switches a plurality of resistors respectively connected to the support pin 222 and the guide pin 223 to control charges around the substrate. The charge control device 300 may be installed inside and outside the supporting member 220.

The first switch 310 electrically connects the support pin 222 and the first resistor 320. The first switch 310 may be installed on a line connecting the support pin 222, the first resistor 320 and the ground 360, and may be installed between the support pin 222 and the first resistor 320 on the line.

The first switch 310 may be switched under the control of the control unit 350 to electrically connect the support pin 222 and the first resistor 320. For example, when the first switch 310 is set to switching on by the control unit 350, the support pin 222 and the first resistor 320 are electrically connected. At this time, the charge located around the substrate (W) moves to the ground 360 through the support pins 222 and the first resistor 320 in turn, and accordingly, the amount of charges existing around the substrate (W) may be reduced.

On the other hand, when the first switch 310 is set to switching off by the control unit 350, the support pin 222 and the first resistor 320 are not electrically connected. Accordingly, charges located around the substrate (W) cannot move to the ground 360, and the amount of charges existing around the substrate (W) may be maintained.

The first switch 310 may be installed inside the body 221 of the supporting member 220. However, this embodiment is not limited thereto. The first switch 310 may be installed outside the body 221 of the supporting member 220 as long as it can be electrically connected to the support pin 222.

The first resistor 320 controls the movement of charges on a line connecting the support pin 222 and the ground 360. The first resistor 320 may be implemented as a variable resistor so as to control the moving speed of charges.

The first resistor 320 may be installed between the first switch 310 and the ground 360. Like the first switch 310, the first resistor 320 may be installed inside the body 221 of the supporting member 220, and if it can be electrically connected to the first switch 310, the first resistor 320 also may be installed outside the body 221 of the supporting member 220.

The second switch 330 electrically connects the guide pin 223 and the second resistor 340. The second switch 330 may be installed on a line connecting the guide pin 223, the second resistor 340 and the ground 360, and may be installed between the guide pin 223 and the second resistor 340 on the line.

The second switch 330 may be switched under the control of the control unit 350 to electrically connect the guide pin 223 and the second resistor 340. For example, when the second switch 330 is set to switching on by the control unit 350, the guide pin 223 and the second resistor 340 are electrically connected. At this time, the charge located around the substrate (W) moves to the ground 360 through the guide pin 223 and the second resistor 340 in turn, and accordingly, the amount of charges existing around the substrate (W) may be reduced.

On the other hand, when the second switch 330 is set to switching off by the control unit 350, the guide pin 223 and the second resistor 340 are not electrically connected. Accordingly, charges located around the substrate (W) cannot move to the ground 360, and the amount of charges existing around the substrate (W) may be maintained.

The second switch 330 may be installed inside the body 221 of the supporting member 220. However, this embodiment is not limited thereto. The second switch 330 may be installed outside the body 221 of the supporting member 220 as long as it can be electrically connected to the guide pin 223.

The second resistor 340 controls the movement of charges on a line connecting the guide pin 223 and the ground 360. The second resistor 340 may be implemented as a variable resistor so as to control the moving speed of the charge.

The second resistor 340 may be installed between the second switch 330 and the ground 360. Like the second switch 330, the second resistor 340 may be installed inside the body 221 of the supporting member 220, and if it can be electrically connected to the second switch 330, the second resistor 340 also may be installed outside the body 221 of the supporting member 220.

The control unit 350 controls switching of the first switch 310 and the second switch 330. The first switch 310 and the second switch 330 may be set to switching on or switching off according to the control of the control unit 350. The control unit 350 may also control the first resistor 320 and the second resistor 340.

The control unit 350 may be electrically connected to the first switch 310 and the second switch 330 to control switching of the first switch 310 and the second switch 330. The control unit 350 may be implemented as an apparatus including a processor having an arithmetic function (e.g., a computer or a server), and may be installed outside the substrate treating apparatus 200.

As described above, in the example of FIG. 3, a single first resistor 320 electrically connected to the support pin 222 and a single second resistor 340 electrically connected to the guide pin 223 may be used to control the amount of charges located around the substrate (W).

However, this embodiment is not limited thereto. A plurality of first resistors 320 electrically connected to the support pin 222 and a plurality of second resistors 340 electrically connected to the guide pin 223 also may be used to control the amount of charges located around the substrate (W). For example, as shown in FIG. 4, two first resistors 320 electrically connected to the support pin 222 and two second resistors 340 electrically connected to the guide pin 223 may be used to control the amount of charges located around the substrate (W). FIG. 4 is a diagram schematically showing a charge control device installed on a supporting member according to a second embodiment of the present invention.

In the example of FIG. 4, a case, in which a plurality of first resistors 320 and second resistors 340 are provided, is described. In the present exemplary embodiment, a plurality of first switches 310 and a plurality of second switches 330 may be provided, like the first and second resistors 320 and 340, respectively. In this case, the first switches 310 and the second switches 330 may be installed in the same number as the first resistors 320 and the second resistors 340, and may be connected to the first resistors 320 and the second resistors 340 one-to-one.

When a plurality of the first switches 310 and a plurality of the first resistors 320 are respectively installed, the charge amount or the moving speed of the charge can be controlled according to the number of the first switches 310 that are switching connected among the plurality of first switches 310. For example, as shown in the example of FIG. 4, when two first switches 310 and two first resistors 320 are installed, the ground resistance value according to the first resistors 320 may increase when the number of switching connected first switches 310 is two than when the number of the switching connected first switch 310 is one, and accordingly, the charge amount or the moving speed of the charge moving from the substrate (W) to the ground 360 can be controlled.

Likewise, when a plurality of second switches 330 and a plurality of second resistors 340 are respectively installed, the charge amount or the moving speed of charges can be controlled according to the number of the second switches 330 that are switching connected among the plurality of second switches 330. For example, as shown in the example of FIG. 4, when two second switches 330 and two second resistors 340 are respectively installed, the ground resistance value according to the second resistors 340 may increase when the number of switching connected second switches 330 is two than when the number of the switching connected second switch 330 is one, and accordingly, the charge amount or the moving speed of charges moving from the substrate (W) to the ground 360 can be controlled.

In this case, the two first resistors 320 may have the same resistance value. However, this embodiment is not limited thereto. The two first resistors 320 may have different resistance values. In this case, as shown in FIG. 5, a single first switch 310 may be provided, and the ground resistance value according to the first resistors 320 may increase when the first switch 310 is switching connected to 'b resistor' 320b having a relatively large resistance value than when the first switch 310 is switching connected to 'a resistor' 320a having a relatively small resistance value, and accordingly the charge amount or the moving speed of charges moving from the substrate (W) to the ground 360 can be controlled. FIG. 5 is a diagram schematically showing a charge control device installed on a supporting member according to a third embodiment of the present invention.

Likewise, the two second resistors 340 may have different resistance values. In this case, as shown in FIG. 5, a single second switch 330 may be provided, and the ground resistance value according to the second resistors 330 may increase when the second switch 330 is switching connected to 'd resistor' 340b having a relatively large resistance value than when the second switch 330 is switching connected to 'c resistor' 340a having a relatively small resistance value, and accordingly the charge amount or the moving speed of charges moving from the substrate (W) to the ground 360 can be controlled.

In the example of FIG. 5, a case, in which the two first resistors 320 and the two second resistors 340 have different resistance values, is described, but it is also possible that only ones of the two first resistors 320 and the two second resistors have different resistance values.

Meanwhile, as described above, in the example of FIG. 4, the two first resistors 320 may have different resistance values. That is, one of the two first resistors 320 may have a relatively larger resistance value than the other first resistor 320. In this case, if both of the first resistors 320 are utilized, it may be possible to precisely control the charge amount or the moving speed of the charge. This is also the same for the two second resistors 340.

On the other hand, in the present embodiment, as shown in FIG. 6, it is also possible to generate a resistance value deviation by installing more first resistors 320 having the same resistance value on either side among both sides. FIG. 6 is a diagram schematically showing a charge control device installed on a supporting member according to a fourth embodiment of the present invention.

Likewise, as shown in FIG. 6, more second resistors 340 having the same resistance value may be installed on either side among both sides to generate a resistance value deviation.

In the example of FIG. 6, a case, in which a larger number of resistors are installed on either side among both sides for both the first resistors 320 and the second resistors 340, is described. However, this embodiment is not limited thereto. In this embodiment, a larger number of resistors may be installed on either side among both sides only for the first resistors 320, or a larger number of resistors may be installed on either side among both sides only for the second resistors 340.

Meanwhile, in the present embodiment, it is also possible to control the amount of charges located around the substrate (W) by using a plurality of first resistors 320 electrically connected to the support pin 222 and a single second resistor 340 electrically connected to the guide pin 223. For example, as shown in FIG. 7, two first resistors 320 electrically connected to the support pin 222 and one second resistor 340 electrically connected to the guide pin 223 may be used to control the amount of charges located around the substrate (W). FIG. 7 is a diagram schematically showing a charge control device installed on a supporting member according to a fifth embodiment of the present invention.

In addition, in this embodiment, it is also possible to control the amount of charges located around the substrate (W) by using a single first resistor 320 electrically connected to the support pin 222 and a plurality of second resistors 340 electrically connected to the guide pin 223. For example, as shown in FIG. 8, one first resistor 320 electrically connected to the support pin 222 and two second resistors 340 electrically connected to the guide pin 223 may be used to control the amount of charges located around the substrate (W). FIG. 8 is a diagram schematically showing a charge control device installed on a supporting member according to a sixth embodiment of the present invention.

As shown in FIGS. 7 and 8, when a plurality of any ones of the first resistor 320 and the second resistor 340 are provided, the above-described parts with reference to FIGS. 5 and 6 may be applied in the same manner.

In the embodiment described above with reference to FIGS. 3 to 8, each of the support pins 222 may be connected to the first switch 310 and the first resistor 320, and each of the guide pins 223 may be connected to the second switch 330 and the second resistor 340.

However, this embodiment is not limited thereto. As shown in FIG. 9, one support pin 222 and one guide pin 223 may be connected to the first switch 310 and the first resistor 320 at the same time. FIG. 9 is a diagram schematically showing a charge control device installed on a supporting member according to a seventh embodiment of the present invention.

On the other hand, although not shown in the drawing, in this embodiment, it is also possible for a plurality of support pins 222 to be simultaneously connected to one first switch 310 and one first resistor 320, and for a plurality of guide pins 223 to be simultaneously connected to one second switch 330 and one second resistor 340.

Next, the case of controlling the charge by electrically connecting the support pin 222 to the ground 360 and the case of controlling the charge by electrically connecting the guide pin 223 to the ground 360 will be described.

FIG. 10 is an exemplary diagram of a case, in which charges are controlled using a guide pin. The following description refers to FIG. 10.

When the substrate (W) is cleaned using a chemical liquid, the chemical liquid may be supplied to the upper surface of the substrate (W) using the spray member 240. In this case, the charge 410 may be located on the upper surface of the substrate (W).

When the charge 410 is located on the upper surface of the substrate (W), in this embodiment, the charge amount or the moving speed of the charge 410 may be controlled using the guide pin 223.

FIG. 11 is a first exemplary diagram in the case of controlling charge using a support pin. The following description refers to FIG. 11.

When cleaning the substrate (W) using a chemical liquid, the chemical liquid may be supplied to the upper surface of the substrate (W) using the spray member 240, and at the same time, the chemical liquid may be supplied to the bottom surface of the substrate (W) using a back nozzle. In this case, the charge 410 may be located on the upper and lower surfaces of the substrate (W).

When the charge 410 is located on the upper and lower surfaces of the substrate (W), in this embodiment, the charge amount of or the moving speed of the charge 410 may be controlled using the support pin 222. However, this embodiment is not limited thereto. As shown in FIG. 12, it is also possible to control the charge amount or the moving speed of the charge 410 by using the support pin 222 and the guide pin 223. FIG. 12 is a second exemplary diagram in the case of controlling charge using a support pin.

Meanwhile, a plurality of support pins 222 and a plurality of guide pins 223 may be installed on the body 221 of the supporting member 220, respectively. In this case, the charge may be controlled by using some of the support pins 222 among the plurality of support pins 222. In this embodiment, in this case, the charge may be controlled using at least some of the support pins 222 among the plurality of support pins 222 in consideration of the etching rate (ER) of the substrate (W).

Likewise, even when charges are controlled by using at least some of the guide pins 223 among the plurality of guide pins 223, the etching rate of the substrate (W) may be considered.

Next, a method of controlling charge in performing a wafer process (e.g., a cleaning process) will be described.

FIG. 13 is an exemplary diagram illustrating a case, in which a resistor connected to a support pin and a guide pin is used in a substrate treating process. The following description refers to FIG. 13.

When the substrate (W) is mounted on the body 221 of the supporting member 220 and supported by the support pin 222 and the guide pin 223 (Wafer In), the spray member 240 may discharge the chemical liquid onto the upper surface of the substrate (W). In this case, the back nozzle may discharge the chemical liquid onto the bottom surface of the substrate (W).

(1) Before Discharging the Chemical Liquid (510)

Before the spray member 240 and the back nozzle discharge the chemical liquid onto the substrate (W), it is necessary to remove the charges located around the substrate (W) through the ground in order to prevent ESD that may occur when the chemical liquid is discharged. In this case, at least ones of the support pins 222 and the guide pins 223 may be used to control the charge amount of the charge located around the substrate (W). When removing the charge in a short time, both the support pin 222 and the guide pin 223 may be used.

On the other hand, when the charge located around the substrate (W) is removed, the grounded state is transitioned to the non-grounded state.

(2) While Discharging the Chemical Liquid (520)

When the chemical liquid is discharged to the upper and lower surfaces of the substrate (W) by the spray member 240 and the back nozzle, a substrate process (Wafer Process, for example, substrate cleansing process) capable of controlling the Un-Strip and ER by the charge remaining around the substrate (W) and the charge in the chemical liquid is established.

During the substrate process, when a certain time has elapsed, or when it is determined that the amount of charge located around the substrate (W) has reached a predetermined value, the charges located around the substrate (W) may be removed to prevent ESD by transitioning from the non-grounded state to the grounded state. At this time, at least one of the support pin 222 and the guide pin 223 may be transitioned to the grounded state.

In this embodiment, during the substrate process, the transition from the grounded state to the non-grounded state and the transition from the non-grounded state to the grounded state may be repeated N times (where N is a natural number of 1 or more).

In the present embodiment, in controlling the rate, at which charges are discharged, U-Strip and ER adjusting technology can be secured through the control of variable resistors (i.e., the first resistor 320 and the second resistor 340) in the ground path.

(3) After Discharging the Chemical Liquid (530)

When the substrate process is finished, the amount of charge remaining in the substrate (W) may be adjusted through resistance control, thereby satisfying conditions favorable to a subsequent process.

Conventionally, since most of the charges are removed from the substrate for treating the substrate or the amount of charges remaining on the substrate is not known, it has been difficult to utilize the built-up charges in the substrate treating process. In this embodiment, since the amount of charge remaining on the substrate can be adjusted using the charge control device 300, the effect of performing a substrate treating process (for example, a cleaning process) using the built-up charges may be achieved. In addition, in the present embodiment, an effect of controlling an electrostatic added PC according to a change in the amount of charge on the surface of the substrate (W) may be obtained through such a process.

The charge control device 300 and its operating method according to various embodiments have been described above with reference to FIGS. 3 to 13. The charge control device 300 is for preventing Un-Strip and improving Edge ER through ground resistance control. The charge control device 300 may prevent Un-Strip and improve an edge etching rate (ER) through the charge control in a wafer and a solution during a wafer process. In order to prevent Un-Strip and improve ER, the charge control device 300 may control charge movement and ESD with a pin grounding presence/absence and a variable resistor throughout the wafer process.

Although the embodiments of the present invention have been described with reference to the above and the accompanying drawings, those of ordinary skill in the art to which the present invention pertains can understand that the present invention can be implemented in other specific forms without changing its technical spirit or essential features. Therefore, it should be understood that the embodiments described above are illustrative and non-limiting in all respects.

What is claimed is:

1. A substrate supporting member comprising:
a body;
a support pin installed on the body and for supporting a substrate;
a guide pin installed on the body and for supporting the substrate; and
a charge control device configured to control a charge around the substrate by controlling an electrical connection between the support pin and a first resistor and an electrical connection between the guide pin and a second resistor.

2. The substrate supporting member of claim 1, wherein the charge control device comprises:
the first resistor installed on a first line connecting the support pin and a ground;
a first switch installed on the first line and for switching an electrical connection between the support pin and the first resistor;
the second resistor installed on a second line connecting the guide pin and the ground;
a second switch installed on the second line and for switching an electrical connection between the guide pin and the second resistor; and
a control unit for controlling switching of the first switch and the second switch.

3. The substrate supporting member of claim 1, wherein the first resistor is installed on a first line connecting the support pin and a ground,
wherein the second resistor is installed on a second line connecting the guide pin and the ground.

4. The substrate supporting member of claim 3, wherein when a plurality of first resistors are installed, a charge amount of the charge is controlled according to the number of first resistors electrically connected to the support pin among the plurality of first resistors, and/or
wherein when a plurality of second resistors are installed, a charge amount of the charge is controlled according to the number of second resistors electrically connected to the guide pin among the plurality of second resistors.

5. The substrate supporting member of claim 3, wherein when a plurality of first resistors are installed, at least two first resistors among the plurality of first resistors have different resistance values, and a charge amount of the charge is controlled by using the at least two first resistors, and/or
wherein when a plurality of second resistors are installed, at least two second resistors among the plurality of second resistors have different resistance values, and a charge amount of the charge is controlled by using the at least two second resistors.

6. The substrate supporting member of claim 1, wherein the support pin is at least one support pin and the guide pin is at least one guide pin, and
wherein the at least one support pin is electrically connected to the first resistor, and/or
wherein the at least one guide pin is electrically connected to the second resistor.

7. The substrate supporting member of claim 1, wherein at least one of the first resistor and the second resistor is a variable resistor.

8. The substrate supporting member of claim 1, wherein the first resistor and the second resistor are installed inside the body.

9. The substrate supporting member of claim 1, wherein a charge built up around the substrate is used to treat the substrate.

10. The substrate supporting member of claim 1, wherein the charge control device controls a charge when cleaning the substrate using a chemical liquid.

11. The substrate supporting member of claim 10, wherein the charge control device controls the electrical connection between the guide pin and the second resistor when the chemical liquid is supplied to an upper portion of the substrate.

12. The substrate supporting member of claim 10, wherein the charge control device controls the electrical connection between the support pin and the first resistor when the chemical liquid is supplied to upper and lower portions of the substrate.

13. The substrate supporting member of claim 12, wherein the charge control device further controls the electrical connection between the guide pin and the second resistor.

14. The substrate supporting member of claim 1, wherein a plurality of first electrical connections between the support pin and the first resistor are provided, and the charge control device controls at least one first electrical connection among the plurality of first electrical connections, and/or wherein a plurality of second electrical connections between the guide pin and the second resistor are provided, and the charge control device controls at least one second electrical connection among the plurality of second electrical connections.

15. The substrate supporting member of claim 14, wherein the charge control device controls the at least one first electrical connection and/or the at least one second electrical connection based on an etching rate of the substrate.

16. The substrate supporting member of claim 10, wherein the charge control device controls a charge before supplying the chemical liquid to the substrate.

17. The substrate supporting member of claim 10, wherein the charge control device repeatedly controls a charge with a time difference when the chemical liquid is supplied to the substrate.

18. A substrate treating apparatus comprising:
a supporting member including a body, a support pin installed on the body and supporting a substrate, and a guide pin installed on the body and supporting the substrate;
a spray member for supplying a chemical liquid onto an upper surface of the substrate;
a back nozzle for supplying a chemical liquid onto a bottom surface of the substrate; and
a charge control device configured to control a charge around the substrate by controlling an electric connection between the support pin and a first resistor and an electric connection between the guide pin and a second resistor.

19. A substrate treating method comprising:
a first step for controlling a charge amount of a charge around a substrate before treating the substrate; and
a second step for controlling a charge amount of a charge around the substrate while treating the substrate.

20. The method of claim 19, wherein the second step treats the substrate using a chemical liquid, and repeatedly controls a charge amount of a charge with a time difference when the chemical liquid is supplied to the substrate.

* * * * *